United States Patent
Amano et al.

(10) Patent No.: US 10,380,457 B2
(45) Date of Patent: Aug. 13, 2019

(54) LEAD TIP POSITION IMAGE RECOGNITION METHOD AND LEAD TIP POSITION IMAGE RECOGNITION SYSTEM

(71) Applicant: FUJI CORPORATION, Chiryu-shi (JP)

(72) Inventors: Masafumi Amano, Okazaki (JP); Shuichiro Kito, Toyota (JP); Taizo Umezaki, Kasugai (JP)

(73) Assignee: FUJI CORPORATION, Chiryu-shi (JP)

( * ) Notice: Subject to any disclaimer, the term of this patent is extended or adjusted under 35 U.S.C. 154(b) by 0 days.

(21) Appl. No.: 15/772,825

(22) PCT Filed: Nov. 9, 2015

(86) PCT No.: PCT/JP2015/081520
§ 371 (c)(1),
(2) Date: May 2, 2018

(87) PCT Pub. No.: WO2017/081736
PCT Pub. Date: May 18, 2017

(65) Prior Publication Data
US 2018/0314918 A1    Nov. 1, 2018

(51) Int. Cl.
*G06K 9/62* (2006.01)
*G06K 9/03* (2006.01)
(Continued)

(52) U.S. Cl.
CPC ............ *G06K 9/6263* (2013.01); *G06K 9/03* (2013.01); *G06T 1/00* (2013.01); *H05K 13/04* (2013.01)

(58) Field of Classification Search
CPC .. G06K 9/6211; G06K 9/6255; G06K 9/4647; G06K 9/66; G06K 9/4604;
(Continued)

(56) References Cited

U.S. PATENT DOCUMENTS 4,608,494 A * 8/1986 Kobayashi ............ H01L 21/681
                                                                250/461.1
4,813,255 A * 3/1989 Birk ..................... H05K 13/023
                                                                72/14.4
(Continued)

FOREIGN PATENT DOCUMENTS

EP   2 861 049 A1   4/2015
JP   5-45123 A      2/1993
(Continued)

OTHER PUBLICATIONS

International Search Report dated Feb. 16, 2016 in PCT/JP2015/081520 filed Nov. 9, 2015.
(Continued)

*Primary Examiner* — Hung Q Dang
(74) *Attorney, Agent, or Firm* — Oblon, McClelland, Maier & Neustadt, L.L.P.

(57) ABSTRACT

An electronic component picked up and held by a mounting head of a component mounter is moved to an imaging position above a component imaging camera, the tip of the lead of the electronic component is imaged from below by the camera to acquire a lead image, and the lead image is inputted into an image recognition device configured from a neural network or the like and imaged processed so as to output the center position of the tip of the lead. Here, whenever an image processing error occurs, the lead image for which the image processing error occurred is displayed on a display device, and an operator specifies the center position of the tip of the lead in the lead image display on the display device and the specified center position is inputted into the image recognition device.

11 Claims, 10 Drawing Sheets

(51) Int. Cl.
  *G06T 1/00* (2006.01)
  *H05K 13/04* (2006.01)
(58) Field of Classification Search
  CPC ........... G06K 2209/19; G06K 9/00798; G06K
    9/00818; G06K 9/4642; G06K 9/00248;
    G06K 9/4614; H05K 13/08; H01L
    21/681; G06T 2207/30148; G06T 7/001;
    H04N 7/18; H04N 7/183; H04N 5/23229;
    H04N 2005/2255; H04N 5/2254; H04N
    9/045; B25J 9/1697; G06F 3/0425; Y10T
    29/53091; Y10T 29/53178
  See application file for complete search history.

(56) References Cited

U.S. PATENT DOCUMENTS

| | | | |
|---|---|---|---|
| 5,058,177 A | | 10/1991 | Chemaly |
| 5,119,436 A | * | 6/1992 | Holdgrafer .......... B23K 20/004 |
| | | | 382/146 |
| 6,289,492 B1 | * | 9/2001 | Dutta-Choudhury ....................... |
| | | | G01N 21/95684 |
| | | | 716/136 |
| 2005/0008212 A1 | * | 1/2005 | Ewing ....................... G06T 7/75 |
| | | | 382/133 |
| 2014/0161346 A1 | * | 6/2014 | Ishiyama ............. G06K 9/4604 |
| | | | 382/154 |

FOREIGN PATENT DOCUMENTS

| | | |
|---|---|---|
| JP | 8-148893 A | 6/1996 |
| JP | 2004-172221 A | 6/2004 |
| JP | 2012-234488 A | 11/2012 |
| WO | WO 2013/183123 A1 | 12/2013 |

OTHER PUBLICATIONS

Rowley, H.A., et al., "Neural Network-Based Face Detection", IEEE Transactions on Pattern Analysis and Machine Intelligence, XP000753322, vol. 20 No. 1, Jan. 1998, pp. 23-38.
Rowley, H.A., et al., "Rotation Invariant Neural Network-Based Face Detection", IEEE, 1998, XP10291717, p. 963.
Garcia, C., et al., "Convolutional Face Finder: A Neural Architecture for Fast and Robust Face Detection", IEEE Transactions on Pattern Analysis and Machine Intelligence, XP 111188968, vol. 26 No. 11, Nov. 2004, pp. 1408-1423.

\* cited by examiner (a) blurry (b) blurry (c) halation (d) halation (e) elliptical (f) portion missing (g) center missing (h) center missing Input layer
(lead image)

Output layer
(lead tip center position)

Positive sample

Input layer
(image of portion
other than lead)

Output layer
(no lead tip
center position)

Negative sample

Raster scan

Blob analysis

LEAD TIP POSITION IMAGE RECOGNITION METHOD AND LEAD TIP POSITION IMAGE RECOGNITION SYSTEM

TECHNICAL FIELD

The present application relates to a lead tip position image recognition method and lead tip position image recognition system for recognizing a center position of a lead tip of an electronic component to be inserted into a through-hole of a circuit board by processing an image of the lead tip captured by a camera.

BACKGROUND ART

When using a component mounter (component insertion assembly device) to insert a lead of an electronic component into a through-hole of a circuit board, for example, as disclosed in patent literature 1 (WO2013-183123), a lead of an electronic component is inserted into a through-hole of a circuit board by using a suction nozzle or chuck device or the like of a mounting head of the component mounter to pick up the electronic component, moving above the circuit board, positioning the lead tip (lower end) of the electronic component directly above the through-hole of the circuit board, and lowering the electronic component. Here, because the position of the electronic component held by the mounting head shifts for each electronic component, before the electronic component held by the mounting head is moved above the circuit board, it is moved to an imaging position above a component imaging camera, the lead tip of the electric is imaged from below by the camera, and by performing image processing of the image using conventional pattern matching, the center position of the lead tip is recognized, then, based on the recognition result, the position deviation of the electronic component is corrected, and the lead of the electronic component is positioned directly above the through-hole of the circuit board.

CITATION LIST

Patent Literature

Patent literature 1: WO2013-1831.23.

BRIEF SUMMARY

Technical Problem

If the shape of the lead tip of the electronic component is a stable round shape, the difficulty level of the image processing is not particularly high, but with recent electronic circuit components, shaft-type leads (insertion pins) are formed, but the tip of the lead is a cut surface, so even for normal components, the lead tip shape is not stable, and, as shown in FIGS. 4(*a*) and 4(*b*), the same type of electronic component is displayed in the image with blurry sections of the lead tip, or as shown in FIGS. 4(*c*) and 4(*d*), scattered light at the lead tip is displayed in the image (halation), or as shown in FIG. 4(*e*), the lead tip displays as an elliptical shape, or as shown in FIG. 4(*f*), a portion of the lead tip does not display, or as shown in FIGS. (g) and (h), a center portion of the lead tip does not display. Thus, even for the same type of electronic component, depending on the state of the cut surface of the lead tip, the lead tips display as various different shapes, such that it is difficult to recognize lead tips with good accuracy by image processing lead images using conventional pattern matching, meaning that the recognition accuracy of the center position of the lead tip is poor.

Therefore, an object of the present disclosure is to recognize with good accuracy a center position of a lead tip from an image captured by a camera even when the shape of lead tips is not stable.

Solution to Problem

To solve the above problems, the present disclosure is a lead tip position image recognition method for recognizing a center position of a lead tip of an electronic component to be inserted into a through-hole of a circuit board by processing an image of the lead tip (hereinafter referred to as "lead image") captured by a camera using an image recognition device, the lead tip position image recognition method including: a learning process in which an operator specifies the center position of the lead tip in the lead image and learning is performed such that an output when the lead image is inputted into the image recognition device is the center position of the lead tip specified by the operator; and a recognizing process of inputting the lead image acquired by imaging the lead tip of the electronic component using the camera into the image recognition device and outputting the center position of the lead tip. Accordingly, even if the shape of the lead tips is not stable, due to the learning process, it is possible to learn the relationship between the shape of the lead tip in the lead image that is inputted and the center position of the lead tip that is to be outputted (training data), and to recognize with good accuracy the center position of the lead tip from an inputted lead image.

In this case, the image recognition device may be configured using a machine learning system such as a neural network.

Also, in the recognizing process, processing may switch to the learning process when an image processing error occurs in which the center position of the lead tip in the lead image cannot be recognized, and learning may be performed such that the output when the lead image for which the image processing error occurred is inputted to the image recognition device is the center position of the lead tip specified by the operator. In this manner, if learning is performed using lead images for which image processing errors occurred, subsequently, even if a similar lead image is inputted to the image recognition device, an image processing error will not occur, and the center position of the lead tip will be recognized with good accuracy, thus, the recognition accuracy of the center position of lead tips can be improved while reducing the frequency of image processing errors.

Also, in the learning process, at least one processing may be performed on the lead image out of rotation, mapping, brightness alteration, or shape alteration to generate multiple images, and learning may be performed such that the output when each of the multiple images are inputted to the image recognition device is the center position of the lead tip specified by the operator. Accordingly, even if there are not many lead images to be used for learning, it is possible to increase the training data (combinations of "input" and "correct output"), such that efficient learning is performed and the recognition accuracy of the center position of lead tips is improved.

Further, in a case of imaging from below an electronic component held by a mounting head of a component mounter using a component imaging camera to perform image recognition of the center position of the lead tip, during an insertion process of inserting the lead of the electronic component by positioning the lead of the electronic component held by the mounting head at the through-hole of the circuit board based on the recognition result of the image recognition device, when a positioning error occurs in which the lead of the electronic component cannot be inserted into the through-hole of the circuit board, processing may switch to the learning process, and learning may be performed such that the output when the lead image for which the positioning error occurred is inputted to the image recognition device is the center position of the lead tip specified by the operator. Accordingly, if learning is performed using lead images for which positioning errors occurred, subsequently, the recognition accuracy of the center position of the lead tip can be improved when a similar lead image is inputted to the image recognition device, and the frequency of positioning errors is reduced.

In general, because high calculating ability is required for learning training data, when performing learning of training data at an image recognition device, it is possible that the calculating ability of the image recognition will be insufficient.

Thus, the learning device that learns the relationship between the lead images inputted to the image recognition device and the center position of the lead tips to be outputted (training data) may be provided separately to the image recognition device, and the results of learning at the learning device may be sent to the image recognition device. Accordingly, because the image recognition device does not have to perform learning of the training data, it is not necessary to raise the calculating ability of the image recognition device to that capable of performing learning of the training data, and learning of the training data and recognition of the center position of the lead tip can be split efficiently between the learning device and the image recognition device.

With the present disclosure, if the calculating ability of the image recognition device is high, learning of the training data and recognizing of the center position of the lead tip may both be performed in the image recognition device. In this case, the image recognition device may be configured to be switchable between a recognition mode in which the image recognition device receives a lead image and outputs the center position of the lead tip, and a learning mode in which learning is performed of the training data; and a specifying means configured to be used by an operator to specify the center position of the lead tip during the learning mode may be provided, wherein the image recognition device may be configured to, when in the learning mode, perform learning such that the center position of the lead tip in the lead image specified by the operator during the learning mode is the output when the lead image is inputted to the image recognition device.

DESCRIPTION OF EMBODIMENTS

Figure 1:
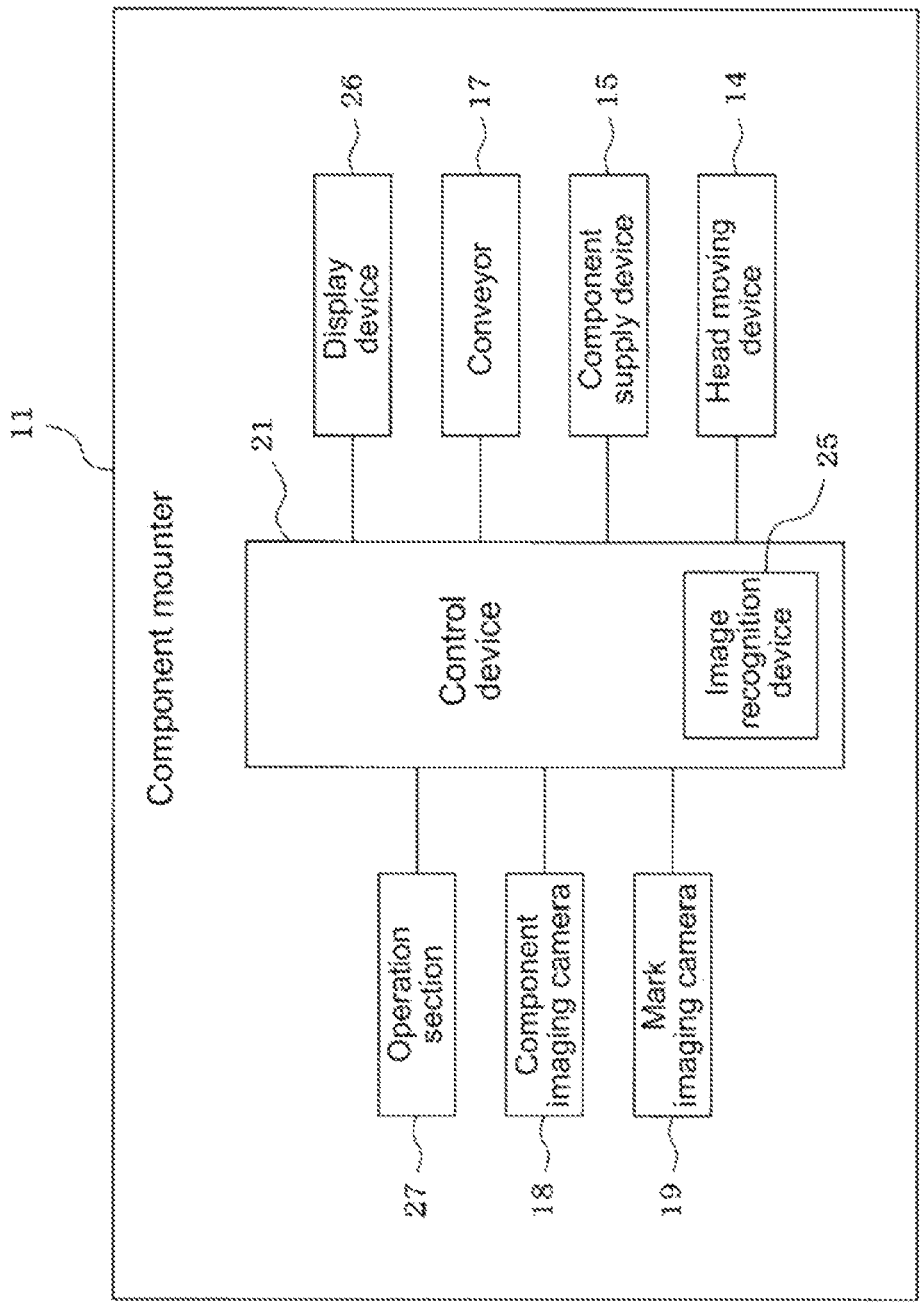
FIG. 1 is a block diagram showing the configuration of a lead tip position image recognition system that is a first embodiment of the present disclosure.
Figure 2:
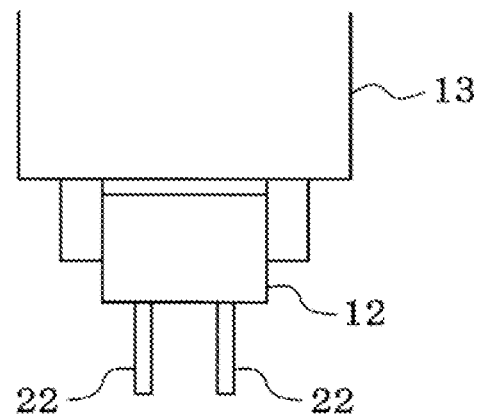
FIG. 2 illustrates a process of imaging lead tips of an electronic component using a camera.
Figure 2:
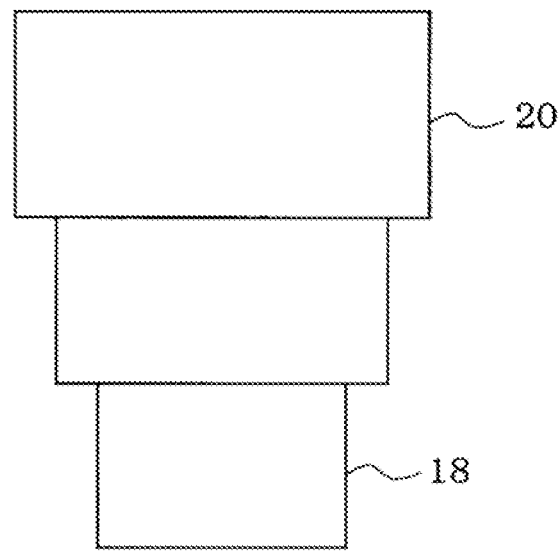
Figure 3:
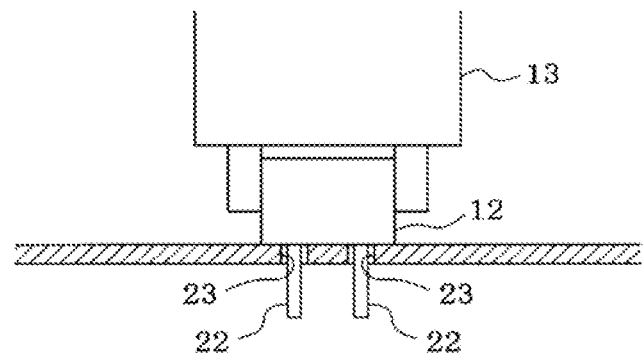
FIG. 3 illustrates a process of inserting leads of an electronic component into through-holes of a circuit board.
Figure 4:
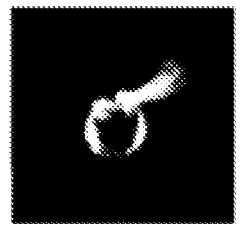
FIGS. 4(a) to 4(h) are lead images in which the lead tips display as various shapes.
Figure 4:
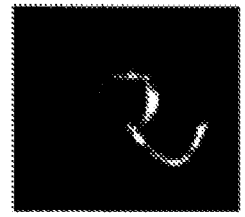
Figure 4:
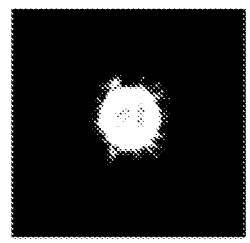
Figure 4:
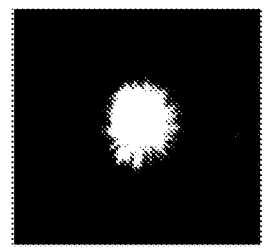
Figure 4:
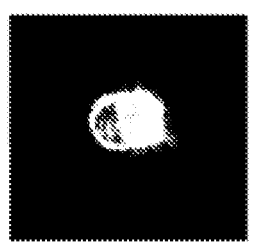
Figure 4:
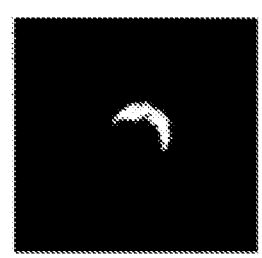
Figure 4:
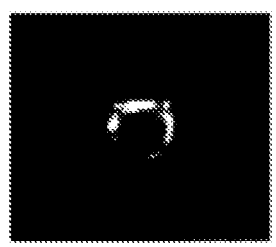
Figure 4:
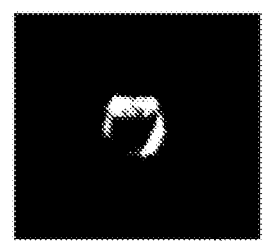

Descriptions of two embodiments for carrying out the present disclosure are given below.

First Embodiment

A first embodiment of the present disclosure will be described based on FIGS. 1 to 11. First, the overall configuration of the component mounter is described using FIGS. 1 to 3.

Component mounter 11 is provided with head moving device 14 that moves mounting head 13 that holds electronic component 12, component supply device 15 that supplies electronic component 12, conveyor 17 that conveys circuit board 16, component imaging camera 18 that images from below electronic component 12 held by mounting head 13, mark imaging camera 19 that images from above reference marks or the like on circuit board 16, and the like. Component imaging camera 18 is fixed facing up between component supply device 15 and conveyor 17, and lighting device 20 that illuminates from below electronic component 12 held by mounting head 13 is attached to an upper portion of component imaging camera 18. Mark imaging camera 19, on the other hand, is attached facing down on mounting head 13, and is moved as one with mounting head 13 by head moving device 14.

Control device 21 of component mounter 11 is configured from a computer or the like, and performs control such that electronic component 12 supplied by component supply device 15 is picked up by mounting head 13, moved above circuit board 16 by head moving device 14, and inserted into through-hole 23 of circuit board 16.

Further, control device 21 of component mounter 11 is equipped to function as image recognition device 25, and before moving the electronic component 12 held by mounting head 13 above circuit board 16, moves the electronic component 12 to an imaging position above component imaging camera 18, uses camera 18 to capture an image from below of the tip (lower end) of lead 22 of the electronic component 12, acquires the lead image, inputs the lead image to image recognition device 25, and outputs the center position of the tip of lead 22. Note that, control device 21 and image recognition device 25 may be configured form separate computers or from one computer.

Image recognition device 25 is configured using a machine learning system such as a neural network or a deep learning system, and in a learning mode (learning process), using learning by training (learning with training), learns a relationship (training data) between the shape of the tip of lead 22 in a lead image that is inputted, and a center position of the tip of lead 22 to be outputted, and then, in a recognition mode (recognition process) recognizes with good accuracy the center position of the tip of the lead 22 from an inputted lead image.

Here, learning of training data may be performed before starting production, but in the first embodiment, learning of training is performed every time an image processing error or a positioning error occurs. Here, "image processing error" refers to a failure to recognize the center position of the tip of lead 22 in the lead image during the recognition process; "positioning error" refers to failure to insert lead 22 of electronic component 12 into through-hole 23 of circuit board 16 in an insertion process in which lead 22 of electronic component 12 held by mounting head 13 is positioned at and inserted into through-hole 23 of circuit board 16.

The training data learning method involves displaying a lead image from when an image processing error or a positioning error occurred on display device 26 such as liquid crystal display or a CRT, and then an operator specifying the center position of the tip of lead 22 in the lead image by operating operation section 27 (specifying means) such as a keyboard, mouse, or touch panel while looking at the lead image displayed on display device 26. Accordingly, image recognition device 25 learns how to make the output when a lead image for which an image processing error or a positioning error occurred is inputted the center position of the tip of lead 22 specified by the operator.

Here, at least one processing may be performed on the lead image out of rotation, mapping, brightness alteration, or shape alteration to generate multiple images, and learning may be performed such that the output when each of the multiple images are inputted to image recognition device 25 is the center position of the tip of lead 22 specified by the operator. Accordingly, even if there are not many lead images to be used for learning, it is possible to increase the training data (combinations of "input" and "correct output"), such that efficient learning is performed and the recognition accuracy of the center position of the tips of leads 22 is improved.

For example, because the directions in which blurs occur at the tip of leads 22 are varied, a lead image with a blur is rotated by a specified angle each time, such that multiple lead images with different rotation angles are created, which means that, no matter which direction blurs occur in, it is possible to recognize with good accuracy the center position of the tip of lead 22 from the lead image.

Figure 5:
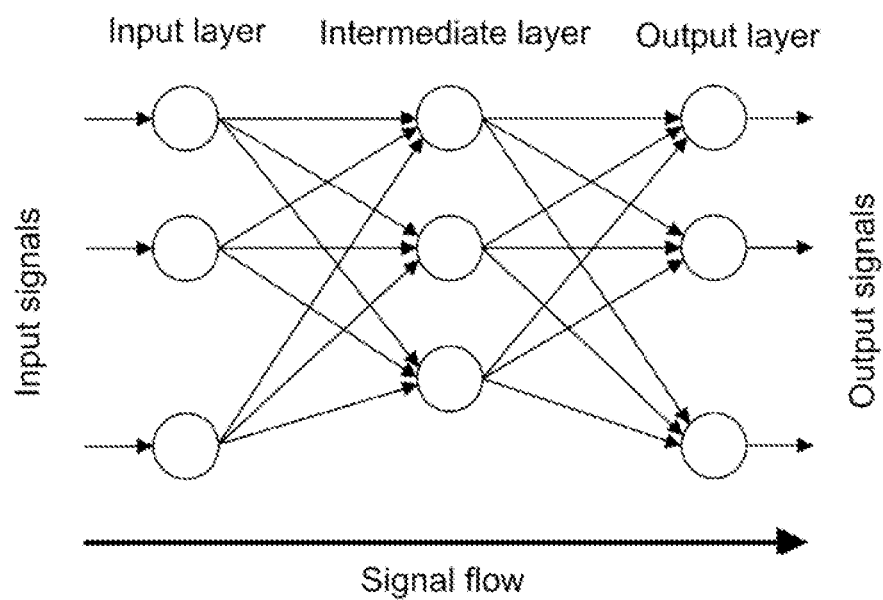
FIG. 5 illustrates a configuration example of a neural network.

In a case in which image recognition device 25 is configured using the neural network shown in FIG. 5, signals flow to an input layer, an intermediate layer (hidden layer) and an output layer. There may be one intermediate layer, or two or more intermediate layers. A neural network refers to an overall model that has problem-solving ability due to each level of neurons (nodes) that form a network by synapse connections having their weighting changed (synapse connection strength) by learning. In a neural network, neurons of an intermediate layer and an output layer receive stimulus from each of the neurons in the previous layer, and those stimuli are combined with weighting and passed to the neurons of the next layer. Here, the weighting is the importance thing, and by changing the weighting in the training data learning process to adjust the output to an appropriate value, even for "unknown inputs", it is possible to achieve "correct outputs" with high accuracy.

In the first embodiment, in the input layer, for example, a lead image of 80 pixels×80 pixels is inputted, and in the output layer where the center position of the tip of lead 22 is in the inputted lead image of 80 pixels×80 pixels is outputted. For ease of understanding, FIG. 6 shows an example of an input and output of 1.0 pixels×10 pixels.

The recognition accuracy of the center position of the tip of lead 22 can be improved by making the output layer larger than the input layer. For example, if the input layer is 80×80 pixels, the output layer may be 160×160 pixels or 320×320 pixels. This makes it possible to perform position recognition at a sub-pixel level with respect to the inputted image.

Figure 6:
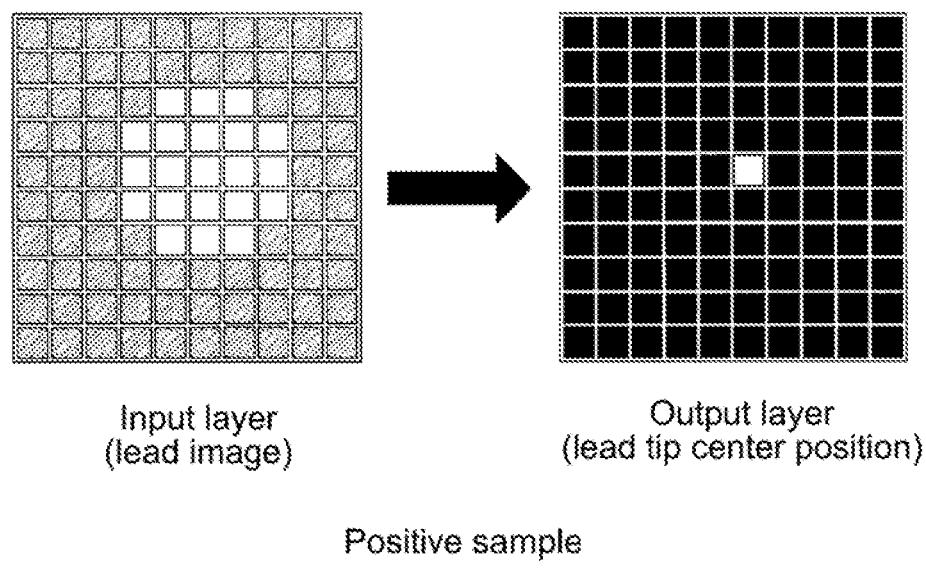
FIG. 6 shows an image of pixel data of an input layer and an output layer of a neural network in a case in which positive sample data is used as training data.
Figure 7:
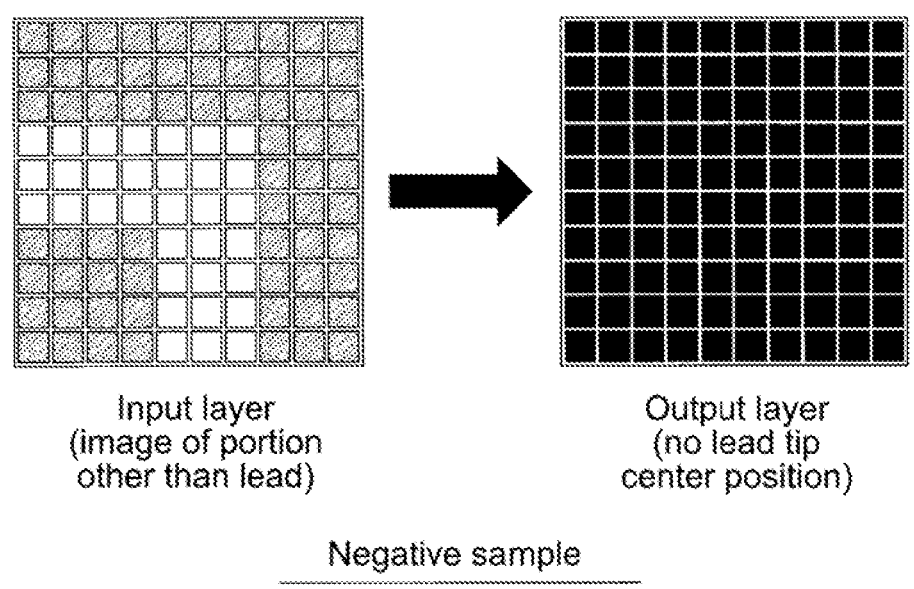
FIG. 7 shows an image of pixel data of an input layer and an output layer of a neural network in a case in which negative sample data is used as training data.

As training data, in addition to inputting and outputting lead images of positive samples as in FIG. 6, it is possible to add inputs and outputs of portions other than leads 22 that are negative samples, as shown in FIG. 7, so as to prevent mis-detection of leads 22.

Learning of training data may be performed by learning and memorizing by each type of electronic component 12, or by shared learning and memorizing for multiple component types.

Figure 8:
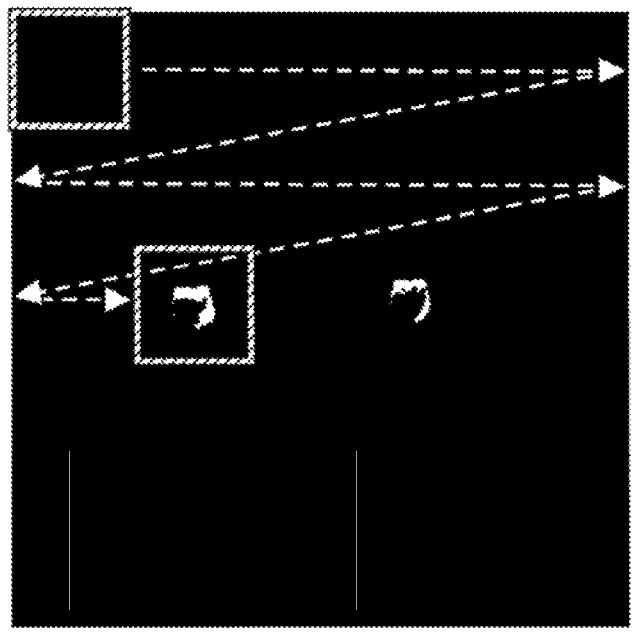
FIG. 8 illustrates a method for detecting a region containing a lead within a captured image using raster scanning.

In positioning processing of lead 22, as shown in FIG. 8, by performing a search in order using raster scanning or the like of the processing range with respect to the captured image that corresponds to the input layer of the neural network, a region of the captured image that contains lead 22 can be detected, and applied to the input layer of the neural network.

Figure 9:
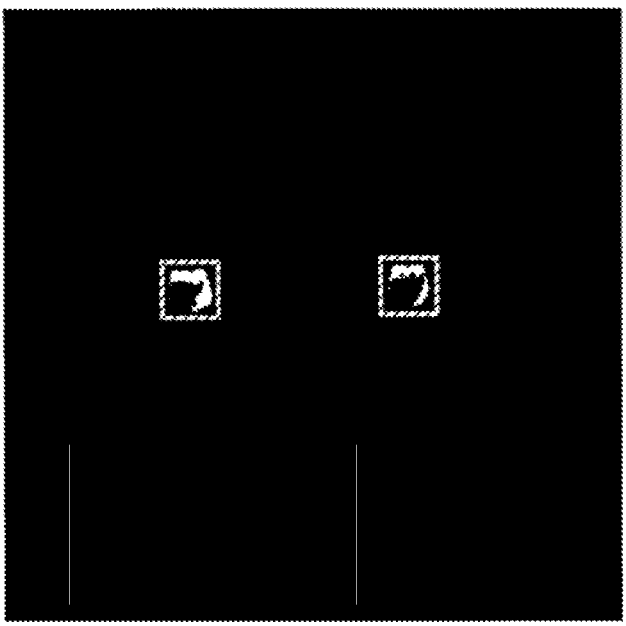
FIG. 9 illustrates a method for detecting a region containing a lead within a captured image using blob analysis.

Alternatively, instead of raster scanning, blob analysis or the like may be used. For example, by performing binarization of the captured image and then blob analysis or the like, as shown in FIG. 9, a candidate region in the captured image that may contain lead 22 may be detected and applied to the input layer of the neural network. With blob analysis or the like, a portion other than lead 22 may be detected, or the position detection accuracy even when detecting a lead may be low, but it is possible to detect lead 22 only with high position detection accuracy using the post-processing of the neural network.

Figure 10:
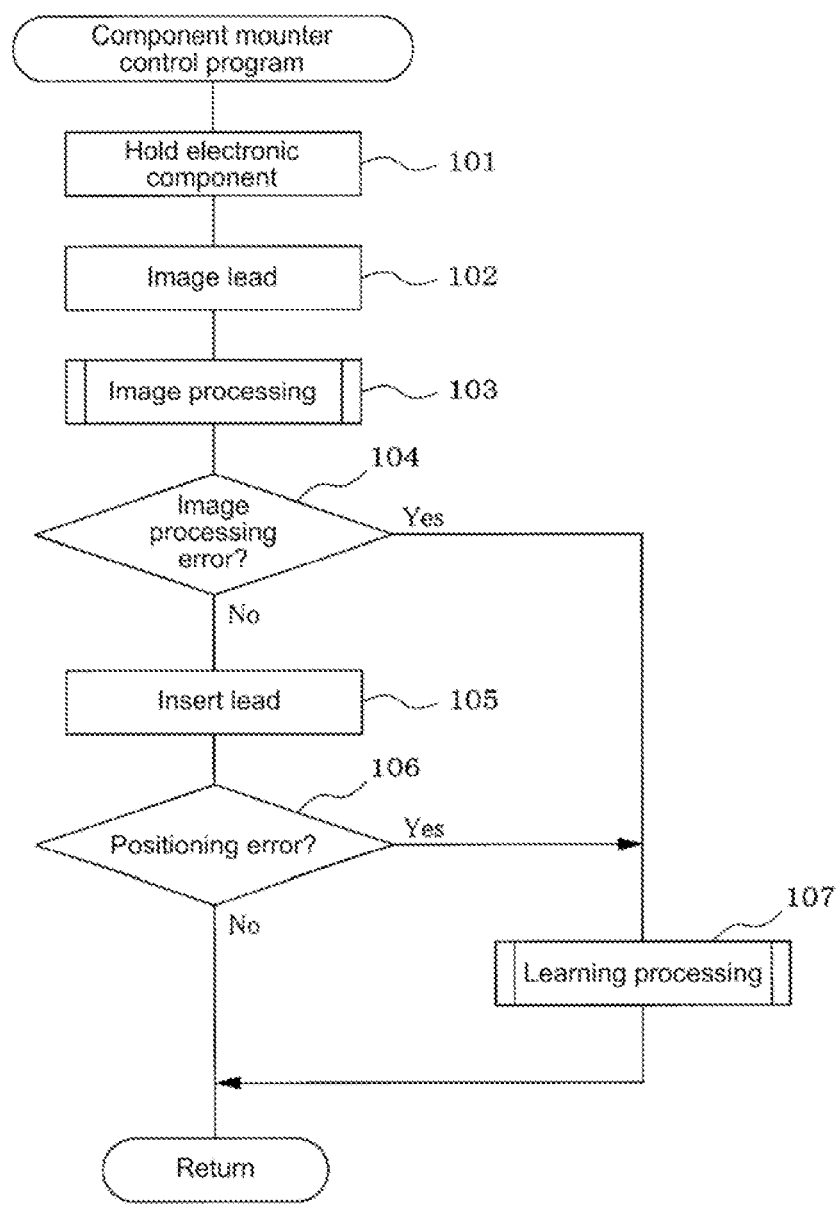
FIG. 10 is a flowchart showing a flow of processing of a component mounter control program.
Figure 11:
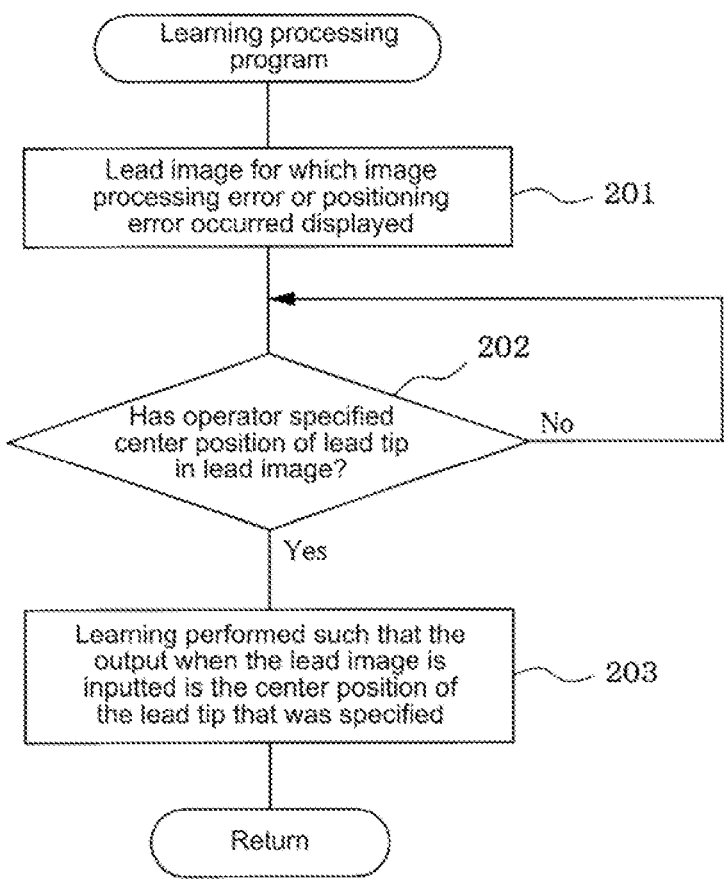
FIG. 11 is a flowchart showing a flow of processing of a learning processing program.

Control device 21 of component mounter 11, by cooperating with image recognition device 25 and performing the programs of FIGS. 10 and 11, uses mounting head 13 of component mounter 11 to pick up and hold electronic components 12 supplied by component supply device 15, recognizes the center position of the tip of lead 22 of the electronic components 12, controls operation of inserting lead 22 of the electronic components 12 into through-holes 23 of circuit board 16, and performs learning of training data each time an image processing error or a positioning error occurs. Processing contents of the programs of FIGS. 10 and 11 are described below.

Component Mounter Control Program

The component mounter control program of FIG. 10 is for controlling operations from picking up and holding electronic component 12 supplied by component supply device 15 until inserting lead 22 of the electronic component 12 into through-hole 23 of circuit board 16, and is performed when pickup operation of the electronic component 12 is started. When the program is performed, first, in step 101, electronic component 12 supplied by component supply device 15 is picked up and held by mounting head 13 of component mounter 11, and moved to an imaging position above component imaging camera 18. Then, continuing to step 102, the tip (lower end) of lead 22 of the electronic component 12 is imaged from below by camera 18 to acquire a lead image.

Then, continuing to step 103, the lead image is inputted into image recognition device 25 and image processing is performed to output the center position of the tip of the lead 22. Then, continuing to step 104, it is determined whether an image processing error occurred (whether the center position of the tip of the lead 22 in the lead image was failed to be recognized). If it is determined that an image processing error occurred, continuing to step 107, the learning processing program of FIG. 11 is performed.

On the other hand, if it is determined in step 104 that an image processing error did not occur, continuing to step 105, the electronic component 12 held by mounting head 13 of component mounter 11 is moved above circuit board 16 and, based on the center position of the tip of lead 22 output from image recognition device 25, the positioning deviation of the electronic component 12 is corrected, lead 22 of the electronic component 12 is positioned directly above through-hole 23 of circuit board 16, then mounting head 13 is lowered such that lead 22 of the electronic component 12 is inserted into through-hole 23 of circuit board 16.

Then, continuing to step 106, it is determined whether a positioning error occurred (whether lead 22 of electronic component 12 was failed to be inserted into through-hole 23 of circuit board 16), and if it is determined that a positioning error did not occur, the program finishes, but if it is determined that a positioning error occurred, continuing to step 107, the learning processing program of FIG. 11 is performed.

Learning Processing Program

The learning processing program of FIG. 11 is performed at step 107 of FIG. 10 when an image processing error or a positioning error occurs. When the program is performed, first, in step 201, the lead image for which the image processing error or the positioning error occurred is displayed on liquid crystal display device 26, and in step 202, processing stands by until an operator specifies the center position of the tip of lead 22 in the lead image by operating operation section 27 while viewing the lead image displayed on display device 26.

Then, when the operator has specified the center position of the tip of lead 22 in the lead image, continuing to step 203, learning is performed such that the output when the lead image for which the image processing error occurred is inputted to image recognition device 25 is the center position of the tip of lead 22 specified by the operator. This learning processing may be performed by image recognition device 25 itself, or by control device 21 of component mounter 11. In the latter case, the result (weighting) of the learning performed by control device 21 of component mounter 11 is sent to image recognition device 25.

According to an embodiment described above, even if the shape of the tips of leads 22 of electronic components 12 is not stable, it is possible to learn the relationship between the shape of the tip of lead 22 in the lead image that is inputted to image recognition device 25 and the center position of the tip of lead 22 that is to be outputted (training data), and to recognize with good accuracy the center position of the tip of lead 22 from the inputted lead image.

Further, in the embodiment above, when an image processing error occurs in which the center position of the tip of lead 22 in the lead image cannot be recognized, because learning is performed such that the output when a lead image for which an image processing error occurred is inputted into image recognition device 25 is the center position of the tip of the lead specified by an operator, subsequently, if the same lead image is inputted into image recognition device 25, an image processing error does not occur, and the center position of the tip of lead 22 can be recognized with good accuracy. Accordingly, it is possible to improve the recognition accuracy of the center position of the tip of lead 22 while reducing the frequency of image processing errors.

Further, in the embodiment above, when a positioning error occurs in which lead 22 cannot be inserted into through-hole 23 of circuit board 16, because learning is performed such that the output when a lead image for which a positioning error occurred is inputted into image recognition device 25 is the center position of the tip of the lead specified by an operator, subsequently, it is possible to improve the recognition accuracy of the center position of the tip of lead 22 in a case in which the same lead image is inputted into image recognition device 25, and the frequency of positioning errors can be reduced.

Second Embodiment

In the embodiment above, because there is more than sufficient calculating ability in image recognition device 25 or control device 21 of component mounter 11, learning of training data and recognition of the center position of the tip of lead 22 are both performed in image recognition device 25 or control device 21 of component mounter 11, but in general, because high calculating ability is required for learning of training data, it is possible that the calculating ability of image recognition device 25 or control device 21 of component mounter 11 will not be sufficient for learning of training data.

Figure 12:
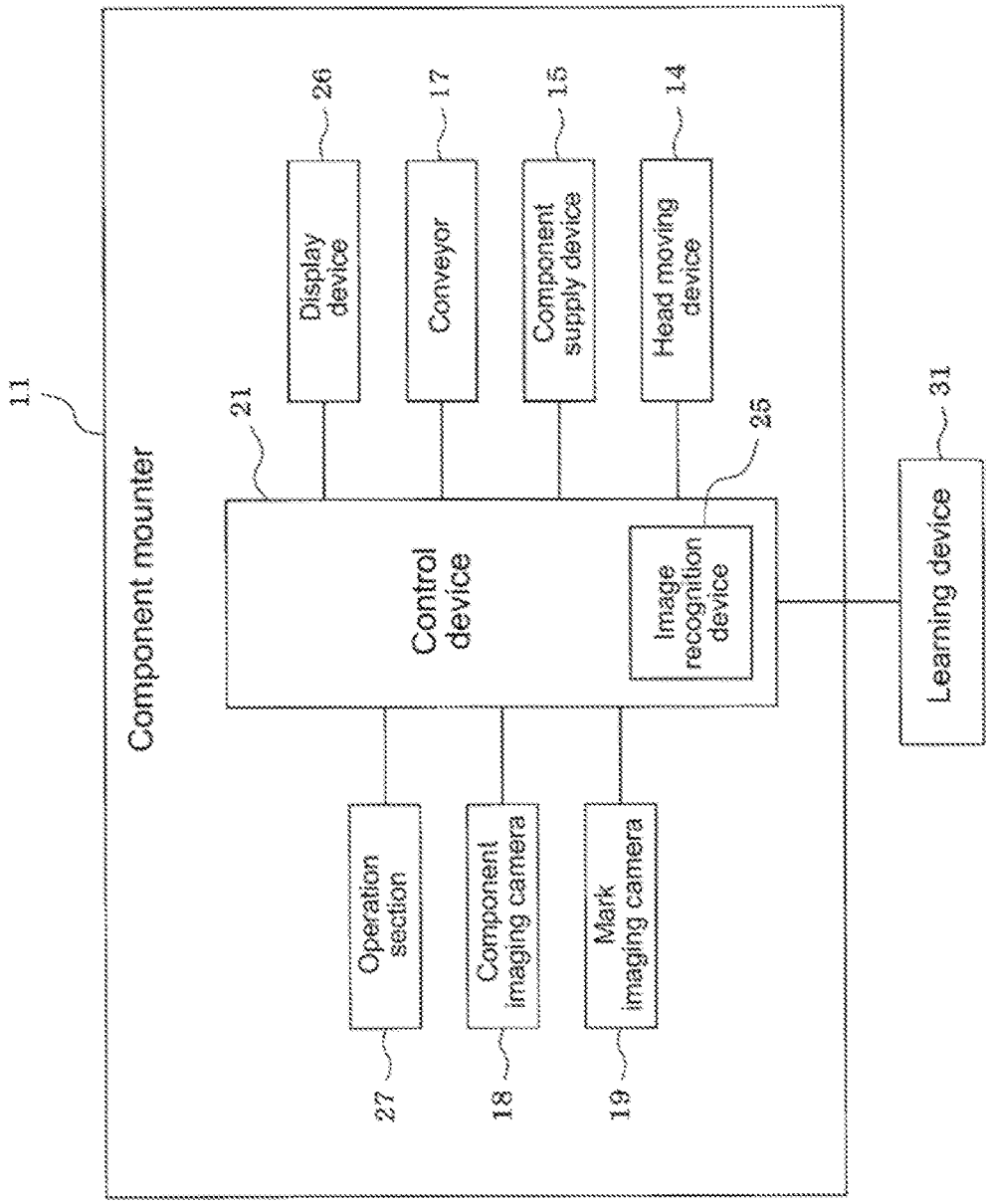
FIG. 12 is a block diagram showing the configuration of a lead tip position image recognition system that is a second embodiment of the present disclosure.

Thus, in a second embodiment of the present disclosure, as shown in FIG. 12, learning device 31 with high calculating ability is provided outside of component mounter 11, and learning device 31 is connected to component mounter 11 via a network, and learning device 31 learns the relationship between the lead image inputted to image recognition device 26 of component mounter 11 and the outputted center position of the tip of lead 22 (training data), and sends the learning result (weighting) to image recognition device 25 of component mounter 11.

In this case, learning device 31 may be configured using a production management computer that manages a production line including component mounter 11, or a computer for learning may be provided separately. Also, learning device 31 may be connected to multiple component mounters 11 via a network, and learning of training data at multiple component mounters 11 may be performed at a single learning device 31.

Further, training data (a lead image and the center position of the tip of lead 22 specified by an operator) may be created at the component mounter 11 side and sent to learning device 31, or only the lead image may be sent to learning device 31, the lead image may be displayed on a display screen of learning device 31, and an operator may specify the center position of the tip of lead 22 in the lead image displayed on the display screen of display device 31.

Note that, training data and learning results may be saved in a server of the production line or in a memory device of component mounter 11, the learning data may be sent to another component mounter 11 of the mounting line, new lead images may be added to the training data, and learning may be performed again.

The present disclosure is not limited to the embodiments above and it goes without saying that various embodiments with changes that do not extend beyond the scope of the disclosure are possible, for example, as lead image that is inputted, edge information (outline boundary line, edge gradient, or the like) of lead 22 may be used, or training data may be learned by an employee of the manufacturer of the component mounter 11 using a learning device, and those learning results (weightings) may be presented to the user of the component mounter 11.

REFERENCE SIGNS LIST

11: component mounter; 12: electronic component; 13: mounting head; 15: component supply device; 16: circuit board; 18: component imaging camera; 21: control device of component mounter; 22: lead; 23: through-hole; 25: image recognition device; 26: display device; 27: operation section (specifying means); 31: learning device

The invention claimed is:

1. A lead tip position image recognition method for recognizing a center position of a lead tip of an electronic component to be inserted into a through-hole of a circuit board by processing an image of the lead tip as a lead image captured by a camera using an image recognition device, the lead tip position image recognition method comprising:
a learning process in which an operator specifies the center position of the lead tip in the lead image and learning is performed such that an output when the lead image is inputted into the image recognition device is the center position of the lead tip specified by the operator; and
a recognizing process of inputting the lead image acquired by imaging the lead tip of the electronic component using the camera into the image recognition device and outputting the center position of the lead tip.

2. The lead tip position image recognition method according to claim 1, wherein
the image recognition device is configured using a neural network.

3. The lead tip position image recognition method according to claim 1, wherein
in the recognizing process, processing switches to the learning process when an image processing error occurs in which the center position of the lead tip cannot be recognized, and learning is performed such that the output when the lead image for which the image processing error occurred is inputted to the image recognition device is the center position of the lead tip specified by the operator.

4. The lead tip position image recognition method according to claim 1, wherein
in the learning process, at least one processing is performed on the lead image out of rotation, mapping, brightness alteration, or shape alteration to generate multiple images, and learning is performed such that the output when each of the multiple images are inputted to the image recognition device is the center position of the lead tip specified by the operator.

5. The lead tip position image recognition method according to claim 1, wherein
the camera is a component imaging camera configured to image from below an electronic component held by a mounting head of a component mounter, and
during an insertion process of inserting the lead of the electronic component by positioning the lead of the electronic component held by the mounting head at the through-hole of the circuit board based on the recognition result of the image recognition device, when a positioning error occurs in which the lead of the electronic component cannot be inserted into the through-hole of the circuit board, processing switches to the learning process, and learning is performed such that the output when the lead image for which the positioning error occurred is inputted to the image recognition device is the center position of the lead tip specified by the operator.

6. A lead tip position image recognition system for recognizing a center position of a lead tip of an electronic component to be inserted into a through-hole of a circuit board by processing an image of the lead tip as a lead image captured by a camera using an image recognition device, the lead tip position image recognition system comprising:
the image recognition device configured to receive a lead image and output the center position of the lead tip;
a learning device configured to learn a relationship between the lead image inputted to the image recognition device and the outputted center position of the lead tip and to send a learning result of the learning to the image recognition device; and
a specifying means configured to be used by an operator to specify the center position of the lead tip,
wherein
the learning device is configured to perform learning such that the center position of the lead tip in the lead image specified by the operator using the specifying means is the output when the lead image is inputted to the image recognition device.

7. A lead tip position image recognition system for recognizing a center position of a lead tip of an electronic component to be inserted into a through-hole of a circuit board by processing an image of the lead tip as a lead image captured by a camera using an image recognition device, the lead tip position image recognition system comprising:
the image recognition device configured to be switchable between a recognition mode in which the image recognition device receives a lead image and outputs the center position of the lead tip, and a learning mode in which learning is performed of a relationship between the inputted lead image and the center position of the lead tip to be output; and a specifying means configured to be used by an operator to specify the center position of the lead tip,
wherein
the image recognition device is configured to, when in the learning mode, perform learning such that the center position of the lead tip in the lead image specified by the operator using the specifying means is the output when the lead image is inputted to the image recognition device.

8. The lead tip position image recognition system according to claim 7, wherein
the image recognition device is configured using a neural network.

9. The lead tip position image recognition system according to claim 7, wherein
the image recognition device, when in the recognition mode, switches to the learning mode when an image processing error occurs in which the center position of the lead tip in the image cannot be recognized, and learning is performed such that the output when the lead image for which the image processing error occurred is inputted to the image recognition device is the center position of the lead tip specified by the operator.

10. The lead tip position image recognition system according to claim 7, wherein
the image recognition device, when in the learning mode, performs processing such that at least one out of rotation, mapping, brightness alteration, or shape alteration is performed on the lead image to generate multiple images, and performs learning such that the output when each of the multiple images are inputted to the image recognition device is the center position of the lead tip specified by the operator.

11. The lead tip position image recognition system according to claim 7, wherein the camera is a component imaging camera configured to image from below an electronic component held by a mounting head of a component mounter, and during an insertion process of inserting the lead of the electronic component by positioning the lead of the electronic component held by the mounting head at the through-hole of the circuit board based on the recognition result of the image recognition device, when a positioning error occurs in which the lead of the electronic component cannot be inserted into the through-hole of the circuit board, processing switches to the learning mode, and learning is performed such that the output when the lead image for which the positioning error occurred is inputted to the image recognition device is the center position of the lead tip specified by the operator.

* * * * *